United States Patent
Kondo et al.

(10) Patent No.: US 10,674,603 B2
(45) Date of Patent: Jun. 2, 2020

(54) CERAMIC CIRCUIT BOARD AND SEMICONDUCTOR DEVICE USING THE SAME

(71) Applicants: KABUSHIKI KAISHA TOSHIBA, Tokyo (JP); TOSHIBA MATERIALS CO., LTD., Yokohama-Shi, Kanagawa (JP)

(72) Inventors: Hiroyasu Kondo, Kanagawa (JP); Tomoyuki Oozeki, Kanagawa (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 0 days.

(21) Appl. No.: 16/082,526

(22) PCT Filed: Mar. 14, 2017

(86) PCT No.: PCT/JP2017/010259
§ 371 (c)(1),
(2) Date: Sep. 5, 2018

(87) PCT Pub. No.: WO2017/169749
PCT Pub. Date: Oct. 5, 2017

(65) Prior Publication Data
US 2019/0090346 A1    Mar. 21, 2019

(30) Foreign Application Priority Data
Mar. 29, 2016 (JP) .................................. 2016-065757

(51) Int. Cl.
*H05K 1/03* (2006.01)
*H05K 1/11* (2006.01)
(Continued)

(52) U.S. Cl.
CPC .......... *H05K 1/0306* (2013.01); *H01L 23/13* (2013.01); *H01L 23/15* (2013.01);
(Continued)

(58) Field of Classification Search
CPC ........ H05K 1/11; H05K 1/115; H05K 1/0306; H05K 2201/0239; H05K 2201/068;
(Continued)

(56) References Cited

U.S. PATENT DOCUMENTS 5,893,954 A * 4/1999 Nanataki ................. B32B 18/00
156/89.11
6,224,703 B1 * 5/2001 Yamasaki ........... H01L 21/4853
427/97.2
(Continued)

FOREIGN PATENT DOCUMENTS

JP     62141744 A * 6/1987 ......... H01L 23/5384
JP     03-102893 A   4/1991
(Continued)

OTHER PUBLICATIONS

Abstract of Suzuki (JP 62-141744A) provided with Office Action (Year: 1987).*
(Continued)

*Primary Examiner* — Roshn K Varghese
(74) *Attorney, Agent, or Firm* — Foley & Lardner LLP

(57) ABSTRACT

The present invention provides a ceramic circuit board comprising: a ceramic substrate; and at least one of a recess and a through-hole formed in the ceramic substrate, wherein a conductive portion filled with a conductor is provided in the recess or the through-hole, the surface roughness Ra is 1.0 μm or less, and the maximum height Rz is 100 μm or less. It is preferable that the maximum height Rz is 10 μm or less. Further, it is preferable that the surface roughness Ra is 0.5 μm or less. According to the above-described con-
(Continued)

figuration, it is possible to provide a ceramic circuit board having an excellent positionability of the conductive portion for mounting a semiconductor element.

7 Claims, 5 Drawing Sheets

(51) Int. Cl.
*H05K 3/38* (2006.01)
*H01L 23/498* (2006.01)
*H01L 23/15* (2006.01)
*H01L 23/13* (2006.01)

(52) U.S. Cl.
CPC .......... *H01L 23/49827* (2013.01); *H05K 1/11* (2013.01); *H05K 1/0346* (2013.01); *H05K 3/381* (2013.01); *H05K 2201/068* (2013.01); *H05K 2203/11* (2013.01)

(58) Field of Classification Search
CPC ... H05K 2201/0104; H05K 2201/0191; H05K 2201/0332; H05K 2201/0376; H05K 2201/09036; H05K 2201/09045; H05K 2201/091; H05K 2201/09154; H05K 2201/095; H05K 2201/09509; H05K 2201/09863; H05K 2203/1461; H05K 2203/11; H05K 1/0346; H05K 3/381
See application file for complete search history.

(56) References Cited

U.S. PATENT DOCUMENTS

| | | | |
|---|---|---|---|
| 6,429,389 B1* | 8/2002 | Chung | H01L 23/49827 174/261 |
| 7,348,069 B2* | 3/2008 | Ichiyanagi | H01G 2/065 257/E23.077 |
| 2004/0016570 A1* | 1/2004 | Yamamoto | H01L 23/15 174/261 |
| 2005/0078433 A1* | 4/2005 | Ichiyanagi | H01G 2/065 361/301.4 |
| 2007/0170593 A1* | 7/2007 | Kitajima | H01L 23/49827 257/774 |

FOREIGN PATENT DOCUMENTS

| | | |
|---|---|---|
| JP | 03-276790 A | 12/1991 |
| JP | 03-283590 A | 12/1991 |
| JP | 09-219577 A | 8/1997 |
| JP | 63-216398 A | 9/1998 |
| JP | 2002-319758 A | 10/2002 |
| JP | 2006-005252 A | 1/2006 |
| JP | 2006-287126 A | 10/2006 |
| JP | 2015-008268 A | 1/2015 |

OTHER PUBLICATIONS

Machine Translation of Suzuki (JP 62-141744A) provided with Office Action (Year: 1987).*

* cited by examiner

CERAMIC CIRCUIT BOARD AND SEMICONDUCTOR DEVICE USING THE SAME

TECHNICAL FIELD

Embodiments described herein relate to a ceramic circuit board and a semiconductor device using the same.

BACKGROUND ART

A ceramic circuit board is used as a substrate on which a semiconductor element is mounted. Examples of the semiconductor elements may include various elements such as a power element, a light emitting diode (LED), a laser diode or the like. A conventional ceramic circuit board is formed by bonding a metal plate onto a ceramic substrate. Specifically, it has a structure in which materials are laminated in the order of metal-plate/ceramic-substrate/metal-plate. In such a laminated structure, there is a problem that a warp tends to occur in the ceramic circuit board due to the difference in thermal expansion coefficient between the ceramic substrate and the metal plate.

Semiconductor devices are increasing in output year by year, so as to exhibit a high power. Along with this increasing output power, the operation compensation temperature (i.e., junction temperature) is getting higher. It is said that the operation compensation temperature will be 150° C. for the seventh generation semiconductor and 175° C. or more for the eighth generation semiconductor. Thus, there has been also posed a problem such that the heat cycle resistance of the ceramic circuit board deteriorates due to the difference in thermal expansion coefficient between its constituent materials.

Further, in an adopted structure, a through-hole (via-hole) is provided in the ceramic substrate and the front and back (rear) of the ceramic circuit board are made to secure an electrical conduction with each other by this through-hole.

For instance, Japanese Unexamined Patent Application Publication No. 2006-287126 (Patent Document 1) discloses a structure for achieving the electrical conduction by a through hole. Patent Document 1 discloses a ceramic circuit board for mounting an LED.

In case of the through-hole type ceramic circuit board as disclosed in Patent Document 1, the metal plate is not bonded, and thus occurrence of a warp of the ceramic circuit board can be suppressed. On the other hand, in case of the ceramic circuit board disclosed in Patent Document 1, a portion on which the LED chip is mounted is formed to be convex, and thus polishing the ceramic substrate to form a convex shape is costly. Further, in the ceramic circuit board of Patent Document 1, a wiring pattern is provided on the surface of the through-hole, and thereafter the LED chip is mounted by soldering.

PRIOR ART DOCUMENTS

Patent Documents

Patent Document 1: Japanese Unexamined Patent Application Publication No. 2006-287126

SUMMARY OF THE INVENTION

Problems to Be Solved By the Invention

The thickness of the wiring pattern on the surface of the through-hole is usually about 50 μm. This wiring pattern is, e.g., patterned by conducting an etching treatment to a Cu plated ceramic substrate. For this reason, irregular steps are easily formed in the wiring pattern. When dust or the like adheres to the steps, a short (short circuit) tends to occur and the device tends to be defective. As a further problem, it is difficult to remove the adhered dust when the dust enters between the steps.

The present invention had been achieved in view of the above-described problems, and an object of the present invention is to provide a ceramic circuit board in which heat-cycle resistance characteristics are improved and dust can be easily removed even when the dust adheres to its wiring pattern.

Means for Solving the Problems

In one embodiment, a ceramic circuit board on which at least one of a recess and a through-hole is formed includes a conductive portion that is provided in the recess or the through-hole and is filled with a conductor, wherein the surface roughness Ra of the ceramic circuit board is 1.0 μm or less; and the maximum height Rz of the ceramic circuit board is 100 μm or less.

DESCRIPTION OF EMBODIMENTS

In one embodiment, a ceramic circuit board comprising: a ceramic substrate; and at least one of a recess and a through-hole formed in the ceramic substrate, wherein the ceramic circuit board comprises a conductive portion which is formed by filling a conductor in the recess or the through-hole, wherein the surface roughness Ra of the ceramic circuit board is 1.0 μm or less; and the maximum height Rz of the ceramic circuit board is 100 μm or less.

Figure 1:
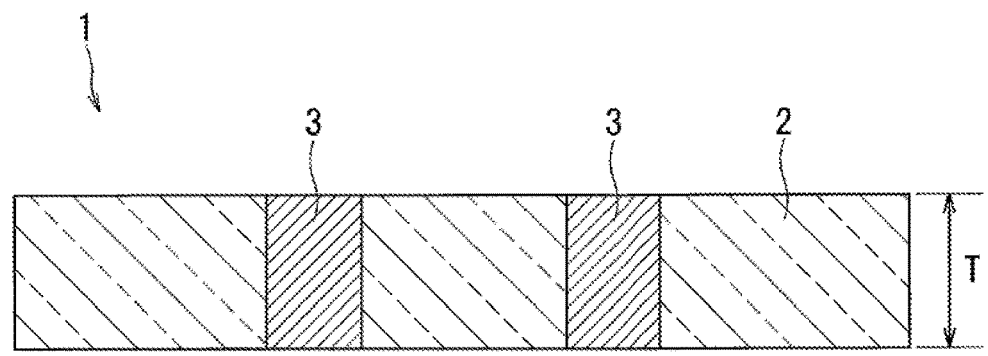
FIG. 1 is a cross-sectional view illustrating a ceramic circuit board according to one embodiment.
Figure 2:
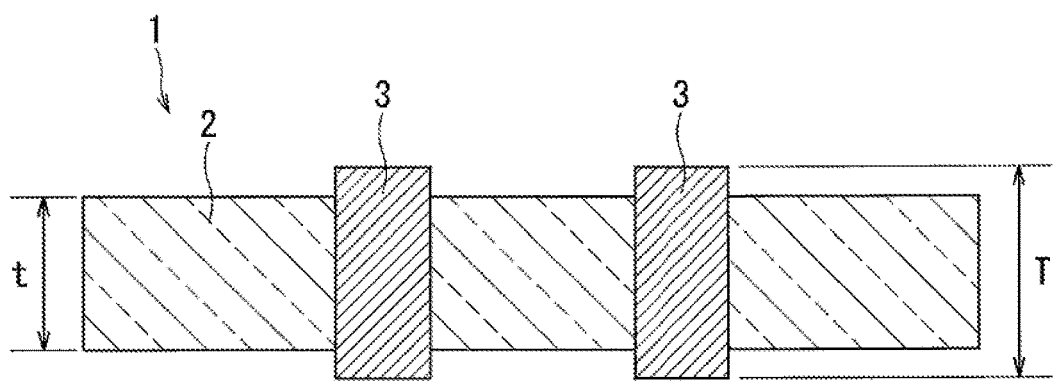
FIG. 2 is a cross-sectional view illustrating another ceramic circuit board according to the embodiment.
Figure 3:
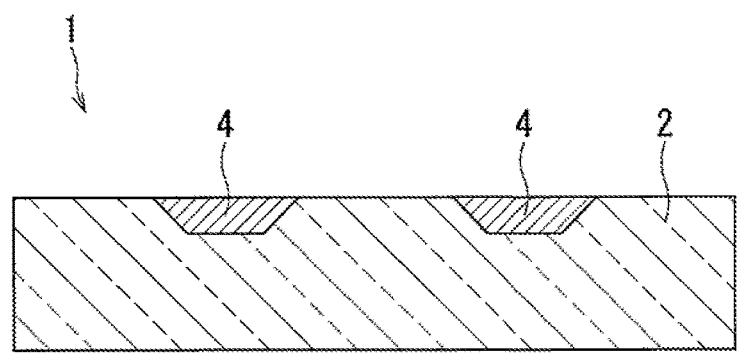
FIG. 3 is a cross-sectional view illustrating still another ceramic circuit board according to the embodiment.
Figure 4:
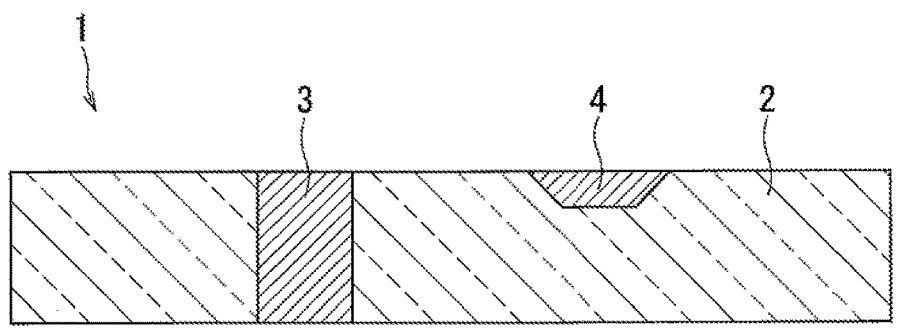
FIG. 4 is a cross-sectional view illustrating yet another ceramic circuit board according to the embodiment.
Figure 5:
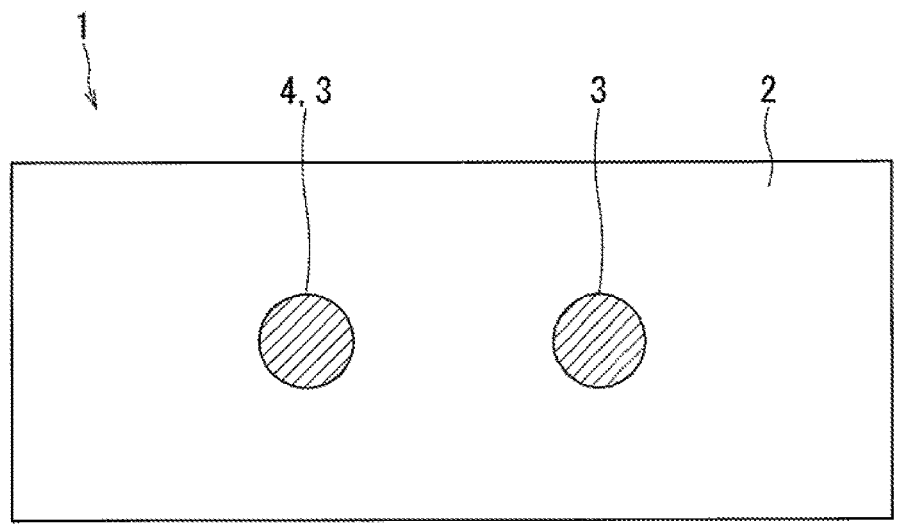
FIG. 5 is a top view illustrating a ceramic circuit board according to the embodiment.

FIG. 1 to FIG. 5 illustrate ceramic circuit boards according to the respective embodiments. In FIG. 1 to FIG. 5, the reference sign 1 denotes a ceramic circuit board, the reference sign 2 denotes a ceramic substrate, the reference sign 3 denotes a through-hole type conductive portion, and the reference sign 4 denotes a recessed type conductive portion. FIG. 1 and FIG. 2 show a structure having through-hole type conductive portions. FIG. 3 shows a structure having recessed type conductive portions. In addition, FIG. 4 shows a structure having both of the through-hole type conductive portion and the recessed type conductive portion. FIG. 5 is a top view of the ceramic circuit board 1.

The ceramic circuit board according to the embodiment comprises: a ceramic substrate; and at least one of a recess and a through-hole formed in the ceramic substrate. As shown in FIG. 1, the through-hole is a hole penetrating through the front and back surfaces of the ceramic substrate 2. Although the through-hole has a linear shape in FIG. 1, it may be a hole having a curved shape or a stepped shape. In addition, the through-hole may have such a shape which is formed by vertically aligning two triangular-shaped cross sections, i.e., the cross-sectional shape of the through-hole is X-shaped.

Further, as shown in FIG. 3, the recess may have a structure in which the recess does not penetrate the ceramic substrate. Although the (trapezoidal) shape widened toward the front surface side of the ceramic substrate is illustrated in FIG. 3, the shape of the recess may be rectangular in cross-section. FIG. 4 shows a structure having both the recess and the through-hole.

FIG. 5 is a top view illustrating the ceramic circuit board according to the embodiment. In FIG. 5, the shape of the top surface of the recess or through-hole is set to be circular. However, the shape of the top surface is not limited to a circle, and it may be formed in various shapes such as a quadrangular shape, an elliptic shape, and a curved shape.

In the recess or the through-hole, a conductive portion filled with a conductor is formed. The conductive portion formed by filling the conductor to inside of the through-hole becomes the through-hole type conductive portion. In addition, the conductive portion formed by filling the conductor to inside of the recess becomes the recessed type conductive portion. The conductive portions serve as wiring for establishing an electrical conduction with the semiconductor element. The semiconductor element is made to have an electrical conduction by a pair of conductive portions. FIG. 1 to FIG. 5 are illustrated as structures having a pair of conductive portions. When plural semiconductor elements are mounted, the number of the conductive portions is increased in accordance with the number of the semiconductor elements.

Additionally, the ceramic circuit board is characterized in that its surface roughness Ra is 1.0 μm or less and its maximum height Rz is 100 μm or less. Ra and Rz are those defined in JIS-B-0601 (2013). In other words, the surface roughness Ra is the arithmetic average roughness. Further, the maximum height Rz is the maximum height roughness.

Even when Ra and Rz are measured at arbitrary points on the surface on which the conductive portion is provided, the ceramic circuit board according to the embodiment has Ra of 1.0 μm or less and Rz of 100 μm or less.

Figure 6:
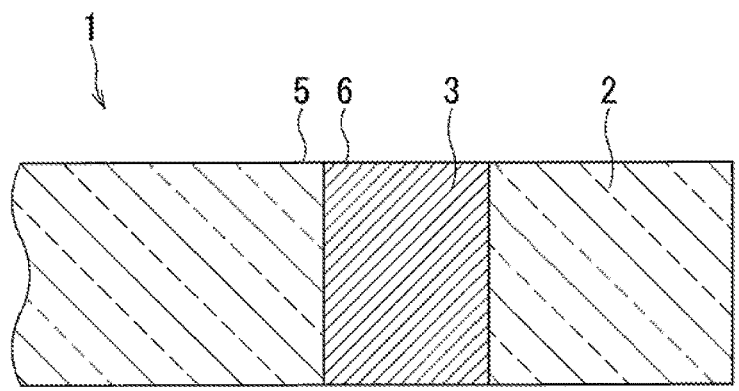
FIG. 6 is a cross-sectional view illustrating an edge portion of a through-hole and an edge portion of a conductive portion in a ceramic circuit board according to the embodiment.

FIG. 6 is a cross-sectional view illustrating the edge portion of the through-hole and the edge portion of the conductive portion in the ceramic circuit board according to the embodiment. In FIG. 6, the reference sign 5 denotes the edge portion of the through-hole and the reference sign 6 denotes the edge portion of the conductive portion. In FIG. 6, the edge portion 5 of the through-hole and the edge portion 6 of the conductive portion are continuous to form a flat surface. Thus, even when the surface roughness of the edge portion 5 of the through-hole and the edge portion 6 of the conductive portion is continuously measured, it is possible to make Ra 1.0 μm or less and Rz 100 μm or less.

Although the through-hole type conductive portion is illustrated in FIG. 6, the recessed type conductive portion may be used instead. That is, the edge portion of the recess and the edge portion of the recessed type conductive portion are connected with each other so as to form a flat surface. Thus, even when the surface roughness is continuously measured for the edge portion of the recess and the edge portion of the recessed type conductive portion, it is possible to make Ra 1.0 μm or less and Rz 100 μm or less.

By adopting such a structure, a large step is not formed at the boundary between the conductive portion and the ceramic substrate. Hence, it is difficult for dust to stick to a portion between the conductive portions. Further, even when dust adheres, the dust can be easily removed by a simple cleaning process such as blowing of air.

In addition, the surface roughness Ra of the ceramic circuit board is preferably 1.0 μm or less, more preferably 0.5 μm or less. Further, the maximum height Rz of the ceramic circuit board is 100 μm or less, more preferably 30 μm or less. More desirably, the maximum height Rz is 10 μm or less. By making the flat surface with small Ra and Rz, it becomes easier to detect the position of the conductive portion by a CCD camera. Since the positional detection of the conductive portion becomes easy as described above, mounting errors during the mounting process of the semiconductor element are considerably suppressed.

Although the lower limit value of the surface roughness Ra is not particularly limited, it is preferable that Ra is 0.01 μm or more. Although the ceramic circuit board can be used even when Ra is less than 0.01 μm, polishing process is indispensable to make Ra 0.01 μm or less. When the polishing process is applied too much, it is easy for the ceramic substrate to be shed. When shedding occurs, there is a possibility that Rz exceeds 100 μm.

It is also preferable that the difference in height in the ceramic substrate between the edge portion of the conductive portion and the edge portion of the recess or the edge portion of the through-hole is 0 μm or more and 5 μm or less. As to height, it does not matter that which one of the edge portion of the recess (or edge portion of the through-hole) and the edge portion of the conductive portion is higher than the other. When the difference in height exceeds 5 μm, a step portion is disadvantageously formed and a problem of adhesion of dust is liable to occur consequently.

Also, the most preferable state is the state where the difference in height between the edge portion of the through-hole (or the edge portion of the recess) and the edge portion of the conductive portion in the ceramic substrate is 0 μm. In this state, as shown in FIG. 1, the thickness of the ceramic substrate 2 matches and coincides with the thickness T of the through-hole type conductive portion 3.

In addition, it is preferable that the difference in height between adjacent conductive portions is 0 μm or more and 5 μm or less. In the case of mounting a flip-chip type semiconductor element as described below, the conductive portions are arranged in pairs. When the height difference between the adjacent conductive portions exceeds 5 μm, the semiconductor element is inclined obliquely. In addition, as long as Ra is 1 μm or less and Rz is 100 μm or less, the thickness T of the conductive portion may be larger than the thickness t of the ceramic substrate as shown in FIG. 2.

Further, by adopting the above structure, creeping discharge can be effectively suppressed. Thus, the shortest distance between adjacent conductive portions or through-holes can be set to 2 mm or less, furthermore 1 mm or less.

Although the lower limit of the shortest distance between adjacent conductive portions or through-holes is not particularly limited, it is preferably 0.5 mm or more. When the shortest distance between adjacent conductive portions or through-holes is less than 0.5 mm, it becomes difficult to form the recesses and/or the through-holes in the process.

The filling factor (filling ratio) of the conductor into the recess or the through-hole is preferably 98% or more and 100% or less. When the filling factor is less than 98%, this means that the amount of the conductor contained in the recessed type conductive portion or in the through-hole type conductive portion is small. As a case where the amount of the conductor is small, there is a case where the amount of conductor filling the inside of the recess or the through-hole is small. When the amount of conductor is small, a large step may be formed between the edge portion of the recess (or the edge portion of the through-hole) and the edge portion of the conductive portion.

When the step is small, a pore is present inside the conductive portion. When there is a pore inside the conductive portion, there is a possibility that it may not be possible to secure the current carrying capacity by the conductive portion. Thus, the filling factor of the conductor filled into the recess or through-hole is preferably 98% or more and 100% or less, more preferably 99% or more and 100% or less. The most preferable filling factor is 100%.

In addition, by setting the filling factor of the conductor to 98% or more, the current carrying capacity can be increased. As a result, it is possible to obtain a ceramic circuit board suitable for such a semiconductor element that a large current is required.

In other words, in the case of mounting a semiconductor element that does not require a large current, the filling factor of the conductor may be less than 98%. In such a case, as shown in FIG. 10 described below, it is preferable to adopt a structure in which a hollow portion (i.e., cavity) 8 is provided in the through-hole type conductive portion 3. That is, a conductive portion is provided as a conductive film formed only on the inner surface of the through-hole. Even when it is a conductive portion formed of a conductor film, the film density of the conductor film is preferably 98% or more.

As a method of measuring the filling factor of the conductor filled in the recess or through-hole, X-ray CT imaging may be used. In the case of X-ray CT imaging, it is possible to distinguish between the conductor and the hollow portion in the conductive portion by image analysis. In addition, Cu, Al, Ag, and Au are elements through which X-rays are easily transmitted. By using the conductive portion formed from at least one element of Cu, Al, Ag, and Au as the main component as described below, it is possible to measure the filling factor in a non-destructive state by X-ray CT imaging.

In addition, it is preferable that the diameter of the recess or the through-hole is 1 mm or less. Further, the diameter is preferably in the range of 0.1 to 0.3 mm (100 to 300 μm). As described hereinbefore, the recessed type conductive portions (or through-hole type conductive portions) form a pair and attempt to electrically conduct with the semiconductor element. As to the semiconductor element, miniaturization is advanced together with higher output power. For instance, in the case of a flip-chip type semiconductor element, the distance between the recessed type conductive portions (or the through-hole type conductive portions) is adjusted so as to match the size of the semiconductor element. When the diameter is larger than 1 mm, it may not fit the size of the semiconductor element. When each recessed type conductive portion or through-hole type conductive portion is so small that its diameter is 1 mm or less and there is a pore inside each conductive portion, the current carrying capacity cannot be secured. Thus, it can be said that the ceramic circuit board according to the embodiment is suitable for mounting a flip-chip type semiconductor element.

Figure 7:
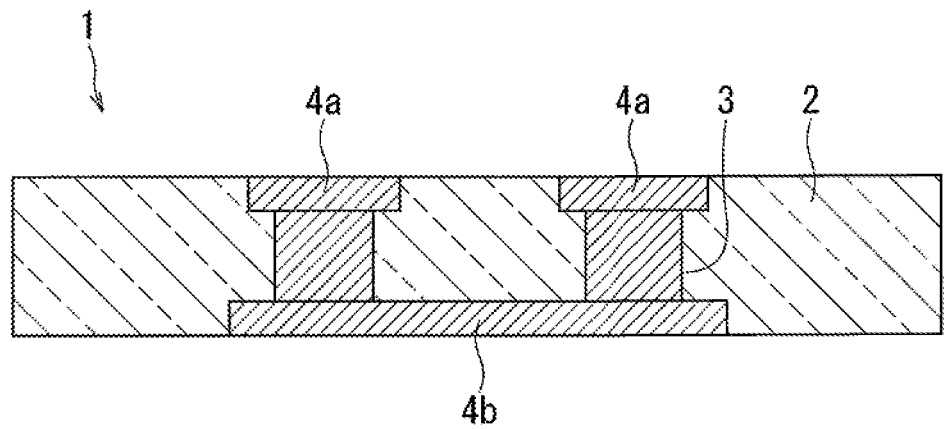
FIG. 7 is a cross-sectional view illustrating another through-hole type conductive portion.
Figure 8:
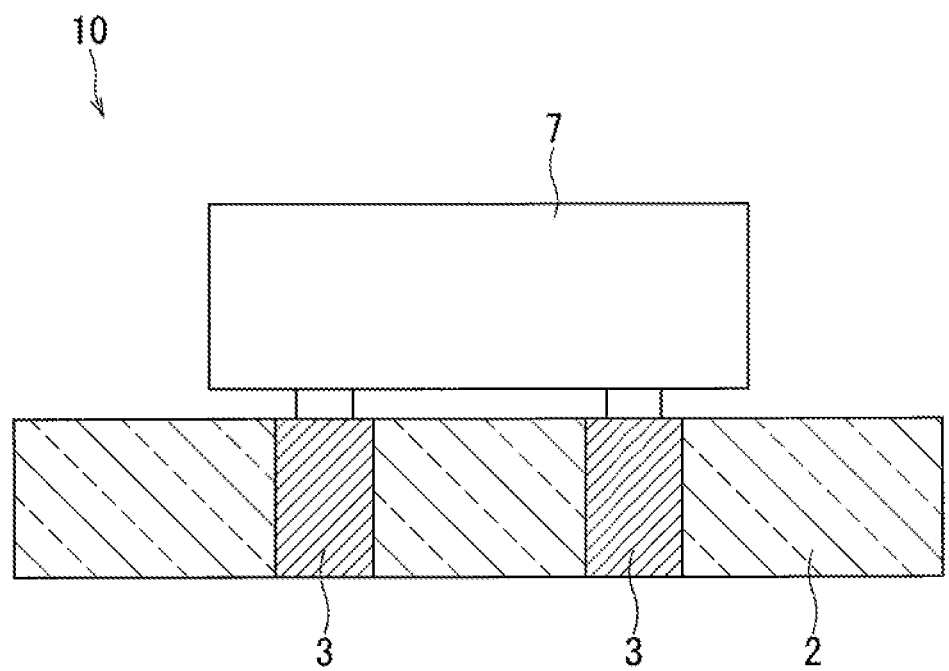
FIG. 8 is a cross-sectional view illustrating a semiconductor device according to the embodiment.

In addition, as shown in FIG. 7, the through-hole type conductive portions 3 and the recessed type conductive portions 4a and 4b may be combined with each other. As needed, a structure in which the back side is connected may be adopted. As shown in FIG. 9A, FIG. 9B, FIG. 10A, and FIG. 10B, it is possible to adopt a structure in which the through-hole type conductive portions 3 and the recessed type conductive portions 4 and 4 are combined in an L shape. In each Figure, the reference sign 1 denotes the ceramic circuit board, the reference sign 3 denotes the through-hole type conductive portion, and the reference sign 4 denotes the recessed type conductive portion.

Figure 9A:
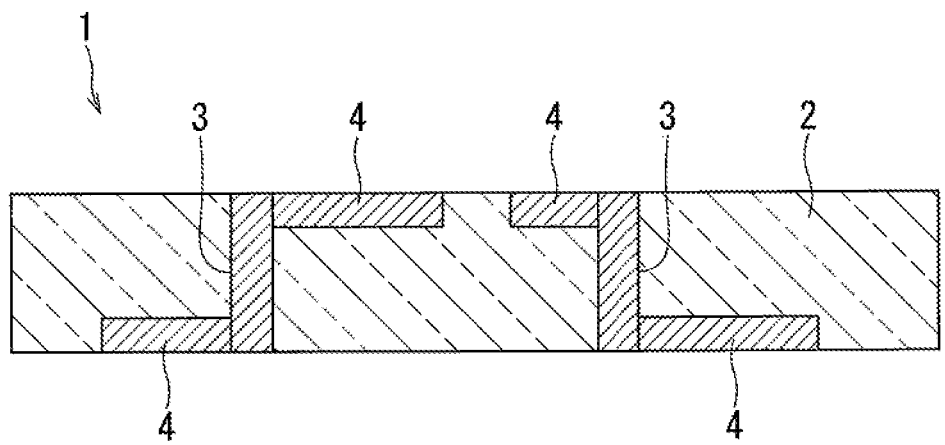
FIG. 9A is a cross-sectional view illustrating still another ceramic circuit board according to the embodiment.
Figure 9B:
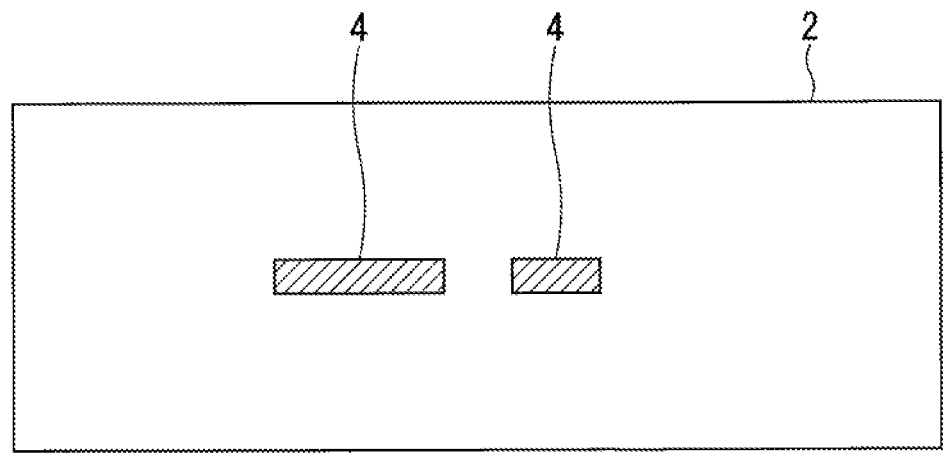
FIG. 9B is a top view of the ceramic circuit board shown in FIG. 9A.
Figure 10A:
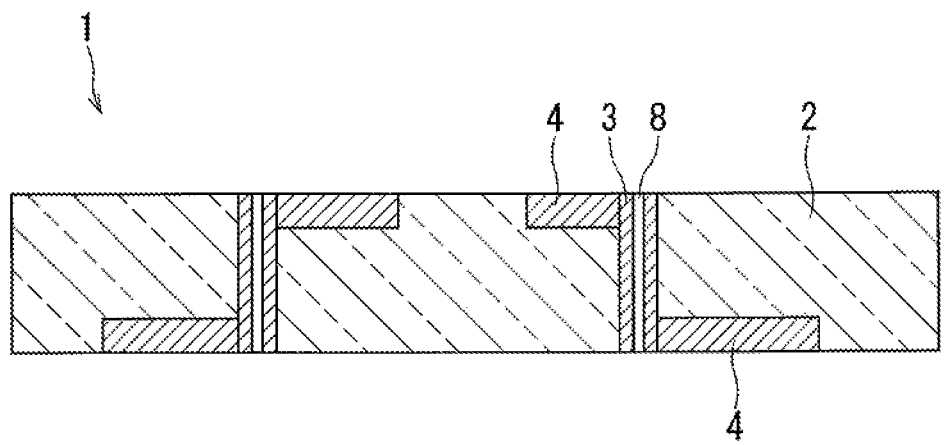
FIG. 10A is a cross-sectional view illustrating still another ceramic circuit board according to the embodiment.
Figure 10B:
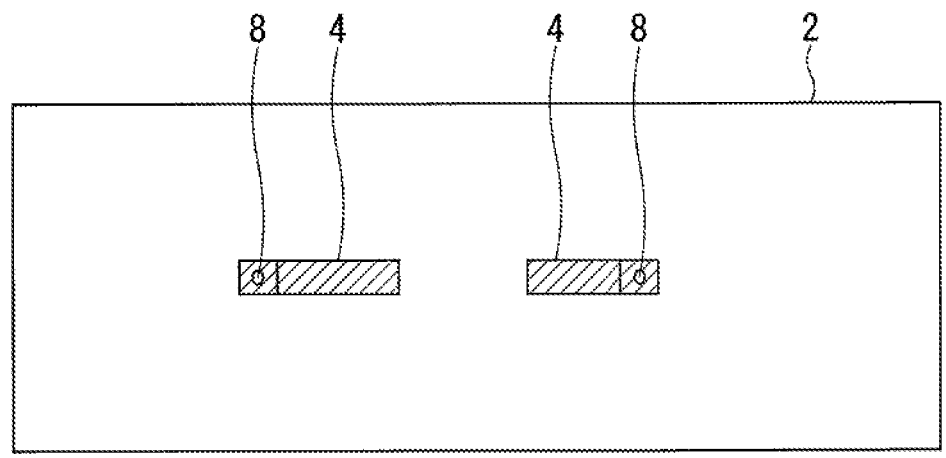
FIG. 10B is a top view of the ceramic circuit board shown in FIG. 10A.

FIG. 10A and FIG. 10B illustrate a structure in which the hollow portion 8 is formed in the central axis direction of each through-hole type conductive portion 3. FIG. 9A is a cross-sectional view and FIG. 9B is a top view. FIG. 10A is a cross-sectional view and FIG. 10B is a top view.

FIG. 10A and FIG. 10B illustrate a structure in which the hollow portion 8 is provided in each through-hole type conductive portion 3. This is a structure in which a conductive portion is provided on the inner surface of each through-hole. In the case of the structure shown in FIG. 10A and FIG. 10B, the filling factor of the conductor filled in the through-hole is less than 98%. In this case, it is preferable that the film density of the conductive film is set to 98% or more.

The conductive portion preferably contains at least one element selected from Cu, Al, Ag, and Au as the main component. These metals have a high electrical conductivity. Further, there is an advantage that the conductive portion is easily formed by a plating method or a method of baking a metal paste. Thus, the filling factor of the conductor filled in a small recess (or through-hole) can be increased. The above-described "as the main component" means that the conductor is contained in the conductive portion in contents of 50% by mass or more and 100% by mass or less. Hence, the conductive portion indicates at least one material selected from Cu, Cu-alloy, Al, Al-alloy, Ag, Ag-alloy, Au, and Au-alloy.

In addition, the ceramic substrate is preferably one of an aluminum nitride substrate, a silicon nitride substrate, an aluminum oxide substrate, a silicon carbide substrate, a silicon oxide substrate, and a zirconium oxide substrate.

In this connection, the aluminum nitride substrate has a high thermal conductivity equal to or higher than 170 W/m·K. In addition, it is possible to make the thermal conductivity equal to or higher than 200 W/m·K. The three-point bending strength of the aluminum nitride substrate is approximately 300 to 450 MPa.

As the silicon nitride substrate, one having a thermal conductivity of 50 W/m·K or more is used. The upper limit of the thermal conductivity is 130 W/m·K or less. The three-point bending strength is so high as to be equal to or higher than 600 MPa.

The aluminum oxide substrate has a thermal conductivity of approximately 20 W/m·K and a three-point bending strength of approximately 400 MPa.

Since the silicon carbide substrate has an electrical conductivity, the silicon carbide substrate is actually used after an insulation process is applied to the portions where the conductive portions are provided.

The zirconium oxide substrate has a three-point bending strength of approximately 400 to 500 MPa.

The aluminum nitride substrate (AlN substrate) is characterized by its high thermal conductivity. On the other hand, its strength is as low as 450 MPa or less. Thus, it is mainstream to set the thickness of the aluminum nitride substrate to approximately 0.635 mm.

The silicon nitride substrate ($Si_3N_4$ substrate) has a three-point bending strength equal to or higher than 600 MPa, and further as high as 700 MPa or more. Thus, the thickness of the substrate is not limited to 0.635 mm, but it can be reduced to 0.32 mm or less. Although the thermal conductivity of the silicon nitride substrate is approximately half that of the AlN substrate, however, the silicon nitride substrate can be made thin and thus the thermal resistance of the silicon nitride substrate is approximately the same as the aluminum nitride substrate. Since the silicon nitride substrate has a high strength, it is possible to reduce the thickness of the ceramic circuit board.

In addition, the aluminum oxide substrate ($Al_2O_3$ substrate) has a low thermal conductivity, but is inexpensive. It is assumed that the material for constituting the ceramic substrate is selected according to the purpose. It is also assumed that sintering aids are added to each ceramic substrate as needed. In the case of placing importance on thermal conductivity, it is preferable to use the AlN substrate. In addition, in the case of placing importance on thin-structure and strength, it is preferable to use the $Si_3N_4$ substrate.

It is preferable to form the conductive portion by using at least one element selected from Cu, Al, Ag and Au as the main component and by adopting any one of the aluminum nitride substrate, the silicon nitride substrate, and the aluminum oxide substrate as the ceramic substrate. In this combination, since the color of the ceramic substrate and the conductive portion are different from each other, the positional detection of the conductive portions by a CCD camera can be easily performed.

The above-described ceramic circuit board is suitable for a semiconductor device in which a semiconductor element is mounted on the conductive portion(s). An example of the semiconductor element may include various elements such as a power element, a light emitting diode (LED), and a laser diode or the like. Further, it is preferable that the semiconductor element is mounted so as to stride the adjacent conductive portions. The above-described "mounted so as to stride over the adjacent conductive portions" means to mount a single semiconductor element by using a pair of conductive portions. As such a semiconductor element, a flip chip type semiconductor element is exemplified.

In the ceramic circuit board according to the embodiment, since the step between the edge portion of the recess (or through-hole) and the edge portion of the conductive portion formed in the ceramic substrate is small, a dust does not adhere to the step. Further, since the respective heights of the adjacent conductive portions are formed to be the same, the semiconductor element can be mounted without being inclined and tilted when being mounted so as to stride over the adjacent conductive portions (i.e., a pair of conductive portions). For instance, in the case of an LED element, when there is an inclination of the element, a large influence appears on the light emission characteristics. In addition, by correctly arranging the semiconductor element straight, it is possible to make it easier to transmit the heat generated from the semiconductor element toward the ceramic circuit board. Further, since a metal plate is not bonded to the ceramic substrate, warping of the ceramic circuit board can be suppressed. Moreover, since a metal plate is not bonded to the ceramic substrate, no stress is generated at the bonding interface between the metal plate and the ceramic substrate and thus the heat-cycle resistance characteristic (TCT characteristic) is also excellent.

Furthermore, by increasing the number of the recessed type conductive portions or the through-hole type conductor portions, it is possible to mount plural semiconductor elements. Additionally, the recessed type conductive portion or the through-hole type conductive portion can be provided to a place where a semiconductor element is desired to be mounted. Thus, the degree of freedom for conducting a module design can be enhanced. For instance, in the case of a ceramic circuit board to which a metal plate is bonded, the metal plate is obliged to be bonded to the portion which is located inside from the end portion of the ceramic substrate. Since it is necessary to secure a creeping surface distance, restrictions to the mounting position of the semiconductor element necessarily occur.

Next, a method of manufacturing the ceramic circuit board according to the embodiment will be described. The manufacturing method of the ceramic circuit board according to the embodiment is not particularly limited as long as it has the above-described configuration.

First, ceramic substrates are prepared. Each ceramic substrate is preferably formed of one member selected from the aluminum nitride substrate, the silicon nitride substrate, and the aluminum oxide substrate. Additionally, the aluminum nitride substrate preferably has a thermal conductivity of 170 W/m·K or more and a three-point bending strength of 300 MPa or more. Further, the silicon nitride substrate preferably has a thermal conductivity of 50 W/m·K or more and a three-point bending strength of 600 MPa or more. Moreover, the aluminum oxide substrate preferably has a three-point bending strength of 350 MPa or more.

Furthermore, the ceramic substrate preferably has a substrate thickness of 0.1 to 3.0 mm, more preferably 0.2 to 1.0 mm. When the substrate strength is smaller than 500 MPa, the substrate thickness is preferably 0.60 mm or more. When the substrate strength is 500 MPa or more, the substrate thickness is preferably less than 0.60 mm. Further, the ceramic substrate may be one to which a sintering aid is added, as needed.

Next, a process of forming recesses or through-holes is performed. This process is performed by etching process, blasting process, laser process, drilling process, and the like. Additionally, it is preferable to directly process the ceramic substrate to provide the recesses or through-holes. Although there is also a method of processing a green sheet, there is a possibility that the positions of the recesses or through-holes are shifted due to contraction caused during the sintering of the green sheet.

The diameter of the recess or the through-hole is preferably set to 1 mm or less. The diameter is preferably set to within a range of 0.1 to 0.3 mm. When the diameter is as small as less than 0.1 mm, the process is difficult to perform. Additionally, when the diameter is larger than 1 mm, it may become larger than the size of the semiconductor element. Further, when too large holes are provided, the strength of the ceramic substrate may be lowered.

Next, a process of forming the conductive portions is performed. Each conductive portion preferably contains at least one material selected from Cu, Al, Ag, and Au as its main component. The method of forming the conductive portions includes a plating method, a method of baking a metal paste, and a method of baking it after inserting a metal column into the through-hole and filling the gap between the through-hole and the metal column with a metal paste.

A pressing process may be performed as needed. It is preferable that the pressing process is performed after performing a plating method or a method of baking the metal paste. Further, the pressing process is preferably performed in such a manner that the conductive portion protruded from the ceramic substrate is pressed. By performing such a method, it is possible to eliminate pores in the conductive portions. Additionally, the filling factor of the conductor in the recess or the through-hole can be attained to 98% or more, furthermore to 100%. The pressing process can also be performed by a pressing machine process using a flat plate or a metal mold. Moreover, it may be pressed while heating the conductive portion. Such a process may include a hot pressing and a HIP (hot isostatic pressing).

A polishing process may be performed as needed. By performing the polishing process, the surface roughness Ra of the ceramic circuit board can be reduced to 1.0 μm or less, further reduced to 0.5 μm or less. Similarly, the maximum height Rz of the ceramic circuit board can be made 100 μm or less, furthermore 10 μm or less.

In addition, by performing the polishing process, it is easy to control the difference in height between the edge portion of the recess (or through-hole) and the edge portion of the conductive portion to 0 μm or more and 5 μm or less. Further, the difference in height between the edge portion of the recess (or through-hole) and the edge portion of the conductive portion may be adjusted by an etching process.

Moreover, a cleaning process is performed as needed. The cleaning process is performed by an air cleaning or the like. In the ceramic circuit board according to the embodiment, since the step between the edge portion of the recess or the through-hole and the edge portion of the conductive portion is small, dust does not easily adhere. Thus, the ceramic circuit board according to the embodiment has an advantage that it can be easily cleaned by the air cleaning.

EXAMPLES

Examples 1 to 10 and Comparative Examples 1 and 2

As ceramic substrates, silicon nitride substrates, aluminum nitride substrates, and an aluminum oxide substrate shown in the following Table 1 were prepared.

TABLE 1

| Substrate No. | Thermal Conductivity (W/m · K) | Three-Point Bending Strength (MPa) | Substrate Size (Length × Width) | Ra (μm) | Rz (μm) |
| --- | --- | --- | --- | --- | --- |
| Silicon Nitride Substrate 1 | 80 | 600 | 50 × 40 × 0.320 | 0.3 | 10.0 |
| Silicon Nitride Substrate 2 | 90 | 700 | 50 × 40 × 0.250 | 0.2 | 6.0 |
| Silicon Nitride Substrate 3 | 95 | 650 | 50 × 30 × 0.320 | 0.3 | 1.2 |
| Silicon Nitride Substrate 4 | 90 | 750 | 40 × 25 × 0.250 | 0.2 | 1.0 |
| Silicon Nitride Substrate 5 | 90 | 650 | 50 × 30 × 0.320 | 0.3 | 8.0 |
| Silicon Nitride Substrate 6 | 90 | 750 | 50 × 30 × 0.200 | 0.2 | 1.1 |
| Aluminum Nitride Substrate 1 | 180 | 400 | 50 × 40 × 0.635 | 0.5 | 10.0 |
| Aluminum Nitride Substrate 2 | 200 | 350 | 50 × 40 × 0.500 | 0.1 | 5.0 |
| Aluminum Oxide Substrate 1 | 20 | 450 | 50 × 40 × 0.635 | 1.0 | 15.0 |

Next, the recesses or the through-holes shown in Table 2 were formed by the laser process. The pairs of the recesses or the through-holes were provided so as to have the interval shown in Table 2. In addition, the silicon nitride substrates 3 to 5 have a structure in which the recessed type conductive portion and the through-hole type conductive portion are combined as shown in FIG. 9A and FIG. 9B.

TABLE 2

| Substrate No. | Recess Size (Diameter × Depth mm) | Through-Hole (Diameter mm) | Interval (mm) |
| --- | --- | --- | --- |
| Silicon Nitride Substrate 1 | 0.2 × 0.1 | — | 1.0 |
| Silicon Nitride Substrate 2 | — | 0.3 | 1.0 |
| Silicon Nitride Substrate 3 | Recess of length 3 mm × width 0.3 mm × depth 0.1 mm and through-hole of diameter 0.3 mm are combined in L-shaped cross-section. Interval between recesses on the front side is 1.0 mm. | | |
| Silicon Nitride Substrate 4 | Recess of length 3 mm × width 0.4 mm × depth 0.1 mm and through-hole of diameter 0.2 mm are combined in L-shaped cross-section. Interval between recesses on the front side is 1.0 mm. | | |
| Silicon Nitride Substrate 5 | Recess of length 3 mm × width 0.3 mm × depth 0.1 mm and through-hole of diameter 0.3 mm are combined in L-shaped cross-section. Interval between recesses on the front side is 1.0 mm. | | |
| Silicon Nitride Substrate 6 | — | 0.3 | 0.8 |
| Aluminum Nitride Substrate 1 | 0.3 × 0.2 | — | 1.0 |
| Aluminum Nitride Substrate 2 | — | 0.2 | 1.0 |
| Aluminum Oxide Substrate 1 | — | 0.5 | 1.0 |

Next, conductive portions shown in Table 3 were formed. The conductive portions were formed by using a Cu paste. Namely, the Cu paste was filled in the recesses or the through-holes and then the filled Cu paste is baked. Thereafter, while the ceramic circuit board is being heated, its top surface and back surface were pressed by using a metal mold. In this manner, the ceramic circuit boards according to the respective Examples were prepared. Further, the surface polishing was performed as needed.

In the Comparative Example 1, the ceramic circuit board was formed so that the conductive portions were protruded from the ceramic substrate. In the Comparative Example 1, the pressing process and the polishing process were not performed.

was confirmed that the step between the edge portion of the recess or through-hole and the edge portion of the conductive portion was very small.

TABLE 3

| Sample No. | Substrate No. | Filling Factor of Conductor of Conductive Portion (%) | Height Difference between Adjacent Condutive Portions (μm) | Height Difference between Edge of Recess or Through-Hole and Conductive Portion (μm) |
|---|---|---|---|---|
| Example 1 | Silicon Nitride Substrate 1 | 100 | 0 | 1 |
| Example 2 | Silicon Nitride Substrate 2 | 100 | 0 | 0 |
| Example 3 | Silicon Nitride Substrate 1 | 99 | 2 | 5 |
| Example 4 | Aluminum Nitride Substrate 1 | 100 | 1 | 1 |
| Example 5 | Aluminum Nitride Substrate 2 | 100 | 0 | 0 |
| Example 6 | Aluminum Oxide Substrate 1 | 99 | 1 | 1 |
| Example 7 | Silicon Nitride Substrate 3 | 100 | 0 | 0 |
| Example 8 | Silicon Nitride Substrate 4 | 100 | 0 | 1 |
| Example 9 | Silicon Nitride Substrate 5 | 100 | 3 | 4 |
| Example 10 | Silicon Nitride Substrate 6 | 100 | 0 | 0 |
| Comparative Example 1 | Aluminum Nitride Substrate 1 | 95 | 30 | 50 |

The surface roughness Ra and the maximum height Rz of the ceramic circuit boards according to the Examples and Comparative Examples were measured in such a manner that measurement was continuously and linearly performed between the edge portion of the recess or through-hole and the edge portion of the conductive portion. The results are shown in Table 4 below.

TABLE 4

| Sample No. | Substrate No. | Ra (μm) | Rz (μm) |
|---|---|---|---|
| Example 1 | Silicon Nitride Substrate 1 | 0.05 | 0.80 |
| Example 2 | Silicon Nitride Substrate 2 | 0.01 | 0.01 |
| Example 3 | Silicon Nitride Substrate 3 | 0.02 | 0.43 |
| Example 4 | Aluminum Nitride Substrate 1 | 0.05 | 0.81 |
| Example 5 | Aluminum Nitride Substrate 2 | 0.01 | 0.02 |
| Example 6 | Aluminum Oxide Substrate 1 | 0.50 | 0.92 |
| Example 7 | Silicon Nitride Substrate 3 | 0.09 | 1.60 |
| Example 8 | Silicon Nitride Substrate 4 | 0.13 | 2.20 |
| Example 9 | Silicon Nitride Substrate 5 | 0.50 | 10.0 |
| Example 10 | Silicon Nitride Substrate 6 | 0.02 | 0.21 |
| Comparative Example 1 | Aluminum Nitride Substrate 1 | 31.0 | 46.0 |

In the ceramic circuit board according to each Example, both Ra and Rz became small values even when the edge portion of the recess or the through-hole and the edge of the conductive portion were continuously measured. Thus, it Next, the durability test was performed on the ceramic circuit board according to each Example and each Comparative Example. Further, easiness of dust removal and easiness of positional detection of the conductive portion by a CCD camera were also investigated for the ceramic circuit board according to each Example and each Comparative Example.

The durability test was performed by a TCT test (thermal cycle test). As to the thermal cycle, it is assumed that one cycle consists of: holding the ceramic circuit board at a temperature of −40° C. for 30 minutes; →holding at room temperature for 10 minutes; →holding at 150° C. for 30 minutes; →holding at room temperature for 10 minutes. Thereafter, the rate of change of the warp amount of the ceramic substrate after 1000 cycles, and the occurrence rate of defects such as cracking were measured. The amount of change in the warp is the amount of change with respect to the warp before the test.

As to the easiness of dust removal, the percentage of residual dust was measured when the substrate surface was cleaned by air cleaning. That is, 100 pieces of ceramic circuit boards were prepared for each Example and Comparative Example. The result shows the percentage of the ceramic circuit boards, in each of which dust remains after cleaning for 1 minute at an air ejecting pressure of 0.25 MPa.

As to the easiness of positional detection by a CCD camera, a process of mounting a semiconductor element was performed 100 times while positional detection was performed by using a CCD camera, and the ratio of occurrence of misalignment (positional mismatch) was investigated.

Further, as the Comparative Example 2, the aluminum nitride substrates (thermal conductivity 180 W/m·K and three-point bending strength 400 MPa) to which a copper plate were bonded was prepared. The size of each aluminum nitride substrate was 50 mm in length×40 mm in width×

0.635 mm in thickness. Additionally, the front side copper plate having a length of 10 mm×a width of 10 mm×a thickness of 0.3 mm was bonded at intervals of 2 mm. Further, as the back (rear) side copper plate, a copper plate having a length of 45 mm×a width of 35 mm and a thickness of 0.2 mm was bonded.

The results of each measurement are shown in Table 5 below.

TABLE 5

| | | Durability Test | | Easiness of Dust Removal (Dust Residual Rate %) | Easiness of Positional Detection by CCD Camera (Misalignment Occurrence Rate %) |
|---|---|---|---|---|---|
| Sample No. | Substrate No. | Change in Warp Amount (%) | Incidence of Cracks (%) | | |
| Example 1 | Silicon Nitride Substrate 1 | 3 | 0 | 0 | 0 |
| Example 2 | Silicon Nitride Substrate 2 | 1 | 0 | 0 | 0 |
| Example 3 | Silicon Nitride Substrate 2 | 2 | 0 | 2 | 0 |
| Example 4 | Aluminum Nitride Substrate 1 | 1 | 0 | 0 | 0 |
| Example 5 | Aluminum Nitride Substrate 2 | 2 | 0 | 0 | 0 |
| Example 6 | Aluminum Oxide Substrate 1 | 1 | 0 | 0 | 0 |
| Example 7 | Silicon Nitride Substrate 3 | 1 | 0 | 0 | 0 |
| Example 8 | Silicon Nitride Substrate 4 | 2 | 0 | 0 | 0 |
| Example 9 | Silicon Nitride Substrate 5 | 5 | 0 | 3 | 0 |
| Example 10 | Silicon Nitride Substrate 6 | 1 | 0 | 0 | 0 |
| Comparative Example 1 | Aluminum Nitride Substrate 1 | 5 | 0 | 7 | 10 |
| Comparative Example 2 | Aluminum Nitride Copper Circuit Board | 7 | 0 | 17 | 20 |

As is clear from the results shown in Table 5, the ceramic circuit board according to each Example showed excellent characteristics. On the other hand, in the Comparative Example 1, both the dust removal performance and the positional detection performance were decreased because of the large step. In addition, the characteristics of the ceramic circuit board in which copper plates were bonded as in the Comparative Example 2 also deteriorated.

Next, the influence of creeping discharge on the ceramic circuit board according to each of the Examples and Comparative Examples was investigated. An alternating voltage (50 Hz) was applied to each conductive portion (through-hole), and the breakdown voltage was measured. The measurement results are shown in Table 6 below.

TABLE 6

| Sample No. | Substrate No. | Shortest Distance between Adjacent Conductive Portions (Through-Holes) (mm) | Dielectric Breakdown Voltage (kV/mm) |
|---|---|---|---|
| Example 1 | Silicon Nitride Substrate 1 | 1.0 | 1.3 |
| Example 2 | Silicon Nitride Substrate 2 | 1.0 | 1.3 |
| Example 3 | Silicon Nitride Substrate 2 | 1.0 | 1.2 |
| Example 4 | Aluminum Nitride Substrate 1 | 1.0 | 1.1 |
| Example 5 | Aluminum Nitride Substrate 2 | 1.0 | 1.1 |
| Example 6 | Aluminum Oxide Substrate 1 | 1.0 | 1.0 |
| Example 7 | Silicon Nitride Substrate 3 | 1.0 | 1.3 |
| Example 8 | Silicon Nitride Substrate 4 | 1.0 | 1.2 |
| Example 9 | Silicon Nitride Substrate 5 | 1.0 | 1.2 |
| Example 10 | Silicon Nitride Substrate 6 | 0.8 | 1.2 |
| Comparative Example 1 | Aluminum Nitride Substrate 1 | 1.0 | 0.8 |

As is clear from the results shown in Table 6, the dielectric breakdown voltage of the ceramic circuit board according to each Example was large. This indicates that creeping discharge is sufficiently suppressed. In particular, the break down voltage of the ceramic circuit board using the silicon nitride substrate was particularly high.

On the other hand, as in the Comparative Example 1, when the difference in height between the edge portion of the recess or the through-hole and the conductive portion was large, the breakdown voltage decreased. As the protruding height of the conductive portion increases, foreign matters and surface contamination between the patterns cannot be completely removed, indicating that creeping discharge is likely to occur.

Several embodiments of the present invention have been illustrated above. However, these embodiments are presented by way of example only and not intended to limit the scope of the invention. These novel embodiments can be implemented in other various forms. Various omissions, substitutions, alterations, and the like of the embodiments can be made without departing from the gist of the invention. These embodiments and modifications thereof are included in the scope and the gist of the invention and included in the inventions described in claims and a scope of equivalents of the inventions. The embodiments described above can be implemented in combination with one another.

REFERENCE SIGNS LIST 1 ceramic circuit board
2 ceramic substrate
3 through-hole type conductive portion
4, 4a, 4b recessed type conductive portion
5 edge portion of through-hole
6 edge portion of conductive portion
7 semiconductor element
8 hollow portion
10 semiconductor device
T thickness of through-hole type conductive portion
t thickness of ceramic substrate

The invention claimed is:

1. A ceramic circuit board comprising: a ceramic substrate containing any one of aluminum nitride, silicon nitride, aluminum oxide, silicon carbide, silicon oxide, or zirconium oxide; and at least one of a recess or a through-hole formed in the ceramic substrate, the ceramic circuit board comprising a conductive portion which is formed by filling a conductor into the recess or the through-hole, wherein a surface roughness Ra of the ceramic circuit board is 1.0 µm or less; and a maximum roughness height Rz of the ceramic circuit board is 30 µm or less, the surface roughness Ra being measured continuously along an edge of the recess or the through-hole and an edge of the conductive portion, a difference in height between an edge portion of the recess or the through-hole formed to the ceramic substrate and an edge portion of the conductive portion is 0 µm or more and 5 µm or less, the conductor filled in the recess or the through-hole has a filling factor of 98% or more and 100% or less, the conductive portion contains at least one element selected from Cu, Al, Ag or Au as a component, a shortest distance of between adjacent conductive portions, between adjacent recesses, or between adjacent through-holes is 2 mm or less, the maximum roughness height Rz is 10 µm or less, the surface roughness Ra is 0.5 µm or less, and the shortest distance is 0.5 mm or more.

2. The ceramic circuit board according to claim 1, wherein a diameter of the recess or the through-hole is 1 mm or less.

3. A semiconductor device configured by mounting a semiconductor element on the conductive portion of the ceramic circuit board according to claim 1.

4. The semiconductor device according to claim 3, wherein the semiconductor element is mounted so as to stride over the conductive portions.

5. The semiconductor device according to claim 3, wherein the semiconductor device is a light emitting diode (LED).

6. The semiconductor device according to claim 3, wherein the shortest distance is 1 mm or less, and the semiconductor device is a light emitting diode (LED).

7. The semiconductor device according to claim 1, wherein the shortest distance is 1 mm or less.

* * * * *